United States Patent [19]
Nomura et al.

[11] Patent Number: 6,163,376
[45] Date of Patent: Dec. 19, 2000

[54] ALIGNMENT APPARATUS, ABERRATION MEASURING METHOD AND ABERRATION MEASURING MARK

[75] Inventors: Hiroshi Nomura, Kawasaki; Takuya Kouno, Yokkaichi, both of Japan

[73] Assignee: Kabushiki Kaisha Toshiba, Kawasaki, Japan

[21] Appl. No.: 09/413,859

[22] Filed: Oct. 7, 1999

[30] Foreign Application Priority Data

Oct. 9, 1998 [JP] Japan .................................. 10-287837

[51] Int. Cl.[7] .................................................. G01B 11/00
[52] U.S. Cl. ............................................................ 356/401
[58] Field of Search ...................................... 356/401, 73

[56] References Cited

U.S. PATENT DOCUMENTS

| | | | |
|---|---|---|---|
| 5,202,748 | 4/1993 | MacDonald et al. | 356/360 |
| 5,615,006 | 3/1997 | Hirukawa et al. | 356/124 |
| 5,754,299 | 5/1998 | Sugaya et al. | 356/401 |
| 5,760,879 | 6/1998 | Shinonga et al. | 355/55 |
| 6,011,611 | 1/2000 | Nomura et al. | 355/67 |

OTHER PUBLICATIONS

Kawamura, E. et al., "Novel Optimization of Total Alignment Error Factors", Japanese Journal of Applied Physics, vol. 36, No. 12B, pp. 7512–7516, (1997).

Shiraishi, N. et al., "Alignment Strategies for Planarizing Technologies", SPIE, vol. 3051, pp. 836–845, (1997).

*Primary Examiner*—Frank G. Font
*Assistant Examiner*—Phil Natividad
*Attorney, Agent, or Firm*—Finnegan, Henderson, Farabow, Garrett, & Dunner, L.L.P.

[57] ABSTRACT

In an alignment apparatus, an alignment mark formed on a substrate is illuminated through an illuminating optical system, and an image of the alignment mark is projected onto a light receiving surface of a CCD camera through an enlarging optical system. The enlarging optical system includes a parallel flat plate, the inclination of which can be adjustable, for parallel-translating an eccentric component of coma.

16 Claims, 12 Drawing Sheets

ALIGNMENT APPARATUS, ABERRATION MEASURING METHOD AND ABERRATION MEASURING MARK

BACKGROUND OF THE INVENTION

The present invention relates to an alignment apparatus mounted on an exposure apparatus, an aberration measuring method and an aberration measuring mark.

Alignment apparatuses mounted on exposure apparatuses used in manufacturing semiconductor devices are classified into three systems. In the first system, a laser beam is radiated on an alignment mark, and light scattered from the alignment mark is detected. In the second system, an image of an alignment mark obtained through an enlarging optical system is projected on a light receiving surface of a CCD camera, and the position of the alignment mark is measured by the image processing technique. In the third system, heterodyne interference is utilized. For example, the LSA sensor of Nikon Corp. utilizes the first system, the FIA sensor of Nikon and the alignment sensor of Canon Inc. utilize the second system, and the LIA sensor of Nikon Corp. and ATHENA of ASML utilize the third system.

The performance of an alignment apparatus required in the actual manufacture of semiconductor devices is judged in two phases. In the first phase, a capability of detecting a signal without fail and a high general-purpose property are required. In the second phase, measurement accuracy and accuracy stability are required. The alignment apparatus of the first system is advantageous in the first phase; i.e., it has a high signal-detecting capability and a high general-purpose property. However, as the size of a semiconductor device is reduced, the alignment apparatus of the first system cannot have fully satisfied requirements for the accuracy in the second phase.

For this reason, expectations for the alignment apparatus of the second system have increased. In other words, so far as an alignment signal is detected, a higher alignment accuracy can be expected in the second system than in the first system. Therefore, the alignment sensor of the second system will be used positively in future, as the low general-purpose property is compensated for by modification of the design of the alignment mark or improvement of the cross-sectional structure.

FIG. 10 is a schematic diagram showing an alignment apparatus of the second system to which the present invention is applied. A light beam emitted from a halogen lamp 2 is radiated on an alignment mark on a substrate 4 through an illuminating optical system 1 and an objective 3. An image of the alignment mark is formed on a light receiving surface of a CCD camera 6 by means of an enlarging projection optical system 5. FIG. 1 shows a mark generally used as the alignment mark. The mark has seven stripe patterns each having a 6 μm width, which are arranged side by side with a pitch of 12 μm. Each stripe pattern has a grooved or projecting cross-sectional structure. The position of the alignment mark is detected by an edge signal of the 6 μm pattern.

To overcome the drawback of the alignment apparatus of the second system, i.e., the low general-purpose property, a document 1 (SPIE vol. 3051, pp. 836–845) reports an improved alignment apparatus wherein the detection capability is increased by an alignment mark with a small difference in level. At present, the phase-shift alignment apparatus disclosed in the document 1 is practically proposed.

The alignment apparatus disclosed in the document 1 can detect a satisfactory signal from an alignment mark of low contrast with a small difference in level. Specifically, a light stop 8 and a 180° phase plate 9 are arranged at positions as shown in FIG. 10. Only the light passed through the central portions of the lenses is 180° phase-shifted. As a result, alignment can be achieved by an alignment mark, from which a satisfactory alignment signal could not be obtained by a conventional apparatus.

The light stop 8 and the phase plate 9 are shown in FIGS. 2A and 2B. FIG. 2A is a plan view of the light stop 8 and the FIG. 2B is a plan view of the phase plate 9. As shown in FIGS. 2A and 2B, the light stop 8 and the phase plate 9 have similar figures. A light shielding portion 91 of the light stop 8 corresponds to a 180° phase shifter of the phase plate 9.

When alignment is performed by the second system, the measurement value of the position of the mark may vary due to so-called manufacture errors, such as the aberration of the enlarging optical system or the deviation of the optical axis. The variation of the measurement value, i.e., the amount of an error in measured position, is considered to be a factor of the alignment offset. Further, it is considered that the alignment offset varies depending on not only the alignment sensor but also the design or the cross-sectional structure of the mark. In other words, the offset includes an alignment offset generated due to a difference in structure between alignment marks in the same exposure apparatus, as well as an alignment offset which varies from one exposure apparatus to another.

In alignment using the same alignment mark, it is considered that the variation of alignment offset among alignment apparatuses results from the aberration in the optical system for projecting an image of the alignment mark on the detector. Similarly, in alignment using the same alignment apparatus, it is considered that the variation of alignment offset among alignment marks of different structures results from the aberration of the optical system.

Conventionally, the alignment offset as described above is avoided by previously providing different correction values in advance for different alignment sensors or different mark structures. Recently, however, the alignment accuracy has been required to be higher and higher. In addition, there has been increasing cases wherein different exposure apparatuses are mixed. Under the circumstances, it is difficult to obtain the required alignment accuracy. Therefore, it is increasingly important to eliminate the alignment offset itself.

A document 2 (Jpn. J. Appl. Phys. Part 1, No. 12B, Vol. 36 (1997) pp. 7512–7516) reports that an alignment offset results from an interaction between aberration or an adjustment error of an alignment apparatus and a cross-sectional shape or a layer structure of an alignment mark. In the document 2, a difference in level of the alignment mark is noticed as a cause of the alignment offset, and a height of the alignment mark and symmetry of an alignment signal are searched.

According to the conventional art, a lens is independently adjusted in advance, and thereafter incorporated into an alignment apparatus. After incorporated, since the lens is adjusted on the basis of symmetry of the alignment signal at the test mark, it is difficult to obtain an accuracy as high as that of the independent adjustment.

As described above, when the conventional alignment apparatus performs alignment, the measurement value of the position of the mark varies due to the aberration of the enlarging optical system. The measurement value varies not only among exposure apparatuses. Even in the same exposure apparatus, the measurement value may vary due to a difference in structure of the alignment mark.

BRIEF SUMMARY OF THE INVENTION

An object of the present invention is to provide an alignment apparatus, whereby an alignment offset which varies among alignment apparatuses or alignment marks is reduced.

Another object of the present invention is to provide a method for adjusting an alignment apparatus, whereby an alignment offset which varies among alignment apparatuses or alignment marks is reduced.

Still another object of the present invention is to provide an alignment mark, whereby an alignment offset which varies among alignment apparatuses or alignment marks is reduced.

According to one aspect of the present invention, there is provided an alignment apparatus comprising: an illuminating optical system for illuminating an alignment mark formed on a base substrate; an enlarging optical system for enlarging an image of the alignment mark; a detector for receiving an image of light passed through the enlarging optical system; and an optical system for parallel-translating a distribution of coma by changing its inclination to an optical axis of the light input to the detector.

It is preferable that the optical system be a parallel flat plate whose inclination is freely adjustable with respect to an optical axis of light reflected by the base substrate.

According to another aspect of the present invention, an aberration measuring method comprising the steps of: illuminating through an illuminating optical system an aberration measuring mark including a first mark portion constituted by a large pattern having a wide pattern width and a second mark portion constituted by a small pattern having a pattern width narrower than that of the large pattern, the large pattern and the small pattern being arranged in parallel, adjacent to each other in at least one direction; projecting an image of the aberration measuring mark onto a light receiving surface of a detector through a projection optical system; detecting positions of the large pattern and the small pattern of the aberration measuring mark; and measuring aberration based on the positions of the large pattern and the small pattern.

It is preferable that the aberration measuring mark have a plurality of large patterns and small patterns of numbers at a desired ratio, which are arranged alternately and symmetrically. Further, first mark portions constituted by large patterns and second mark portions constituted by small patterns of the numbers at a desired ratio may be arranged alternately and symmetrically in two directions. The light reflected from the base substrate is parallel-translated on the basis of the result of measurement using the aberration measuring mark by adjusting the inclination of a parallel flat plate mounted in the projection optical system.

According to still another aspect of the present invention, there is provided an aberration measuring mark comprising a first mark portion constituted by a large pattern having a wide pattern width and a second mark portion constituted by a small pattern having a pattern width narrower than that of the large pattern, the large pattern and the small pattern being arranged in parallel, adjacent to each other in at least one direction, and aberration being measured by a pattern image obtained by illuminating the patterns with light.

With the present invention, the center of an aberration measuring mark and the center of coma are detected by the detector. Based on the detection result, the optical system for parallel-translating an eccentric component of coma provided in the enlarging optical system performs adjustment to make the center of coma coincide with the center of the aberration measuring mark. As a result, the alignment offset which varies among exposure apparatuses or occurs due to the structure of the alignment mark can be reduced.

In particular, the aberration measuring mark of this invention includes a large pattern and a small pattern arranged side by side. When the distance between images of the patterns of the aberration measuring mark is detected by the detector, it is not constant because of eccentricity of coma. In general, the coma distribution is symmetric with respect to the center of the lens, and the greater the distance from the center, the greater the coma. However, if the distribution of coma is eccentric, the coma cannot be symmetric. The eccentricity of coma is one of the causes of the offset which varies depending on the pattern structure and the kind of alignment apparatus. Therefore, the magnitude of coma can be estimated by measuring deviation of the distance between the patterns.

If the aberration measuring mark using the pattern is used, the coma can be adjusted by the optical system for parallel-translating an eccentric component of the coma, so that the distance between the pattern images formed by the main light beam can be constant. As a result, the coma can be symmetric with respect to the center of the projection optical system. Therefore, the offset which varies among alignment apparatuses or alignment marks can be reduced.

Further, since the parallel flat plate is incorporated into the projection optical system and the main light beam is parallel-translated by adjusting the inclination of the plate, the shape of distribution of aberration is not changed by the adjustment. Therefore, the adjustment can be performed easily and quickly.

Furthermore, the aberration measuring mark may be used as an alignment mark, in which case aberration measurement and alignment can be performed simultaneously. Therefore, the position of the alignment mark and the magnitude of coma of the alignment apparatus can be measured simultaneously. As a result, it is possible to realize alignment in which the alignment offset is corrected in advance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described with reference to the accompanying drawings.

First Embodiment

Figure 3:
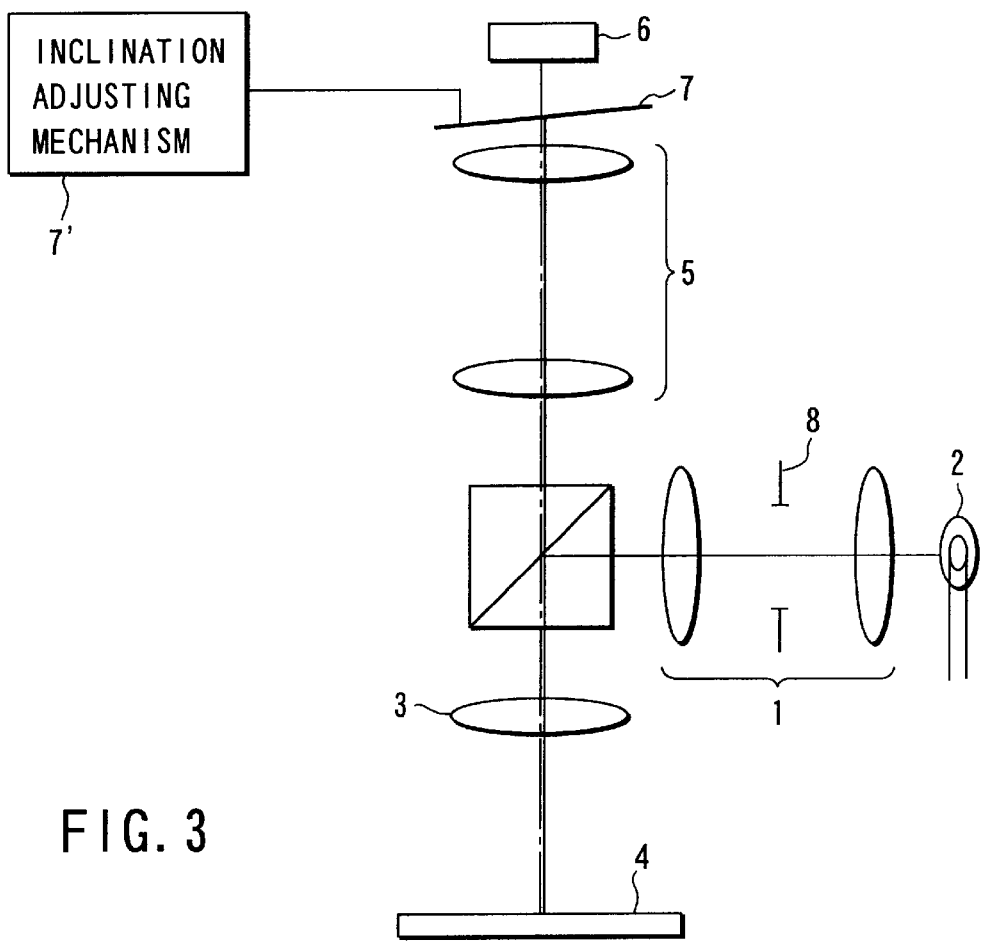
FIG. 3 is a diagram showing the overall structure of an alignment apparatus according to a first embodiment of the present invention.
Figure 4:
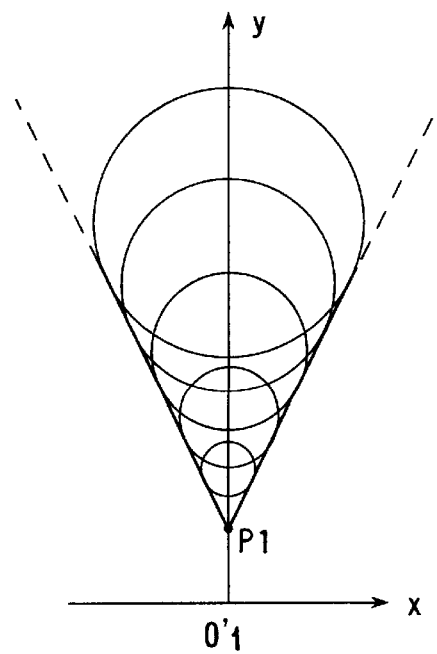
FIG. 4 is a diagram showing a point image in an optical system having coma.
Figure 5:
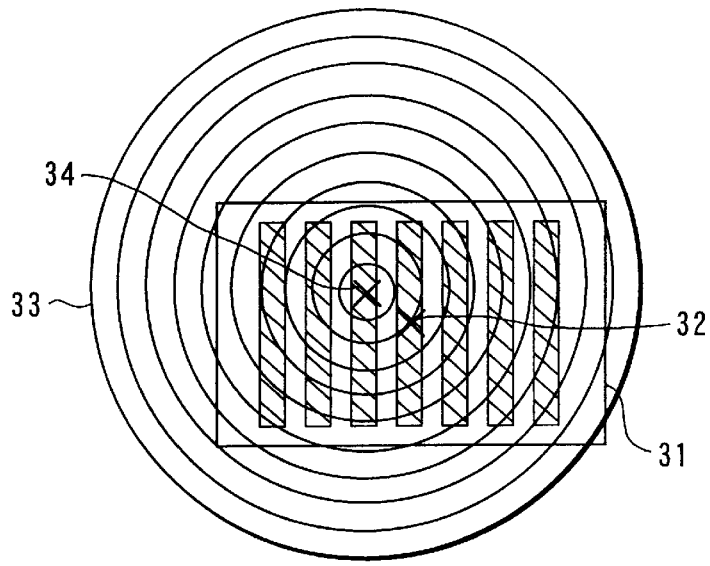
FIG. 5 is a diagram showing the relationship between coma distribution and an aberration measuring mark.

FIGS. 3 to 5 are diagrams for explaining a method for adjusting an alignment apparatus according to a first embodiment of the present invention.

FIG. 3 is a schematic diagram showing the overall structure of the alignment apparatus of the first embodiment. A light beam emitted from a halogen lamp 2 is passed through an objective 3 via an illuminating optical system 1, and radiated on an aberration measuring mark formed on a substrate 4. Light reflected by a portion of the substrate including the aberration measuring mark forms an image of the aberration measuring mark on a light receiving surface of a CCD camera 6 through an enlarging projection optical system 5.

An inclination adjustable parallel flat plate 7 is interposed between the enlarging projection optical system 5 and the CCD camera 6. The main light beam traveling between the parallel flat plate 7 and the substrate 4 can be moved parallel by adjusting the inclination of the parallel flat plate 7. The parallel flat plate 7 is connected to an inclination adjusting mechanism 7' for adjusting the inclination of the parallel flat plate 7. Thus, the function of parallel-translating an aberration distribution is realized by adjusting the inclination of the parallel flat plate 7 incorporated in the projection optical system.

The reason why the aberration distribution is parallel-translated by adjusting the inclination of the parallel flat plate 7 will be described below.

The main light beam can be parallel-translated also by changing the position of an element of the projection optical system 5, such as a lens, laterally with respect to the optical axis or changing the inclination of the lens. However, in this case, since the distribution of the aberration is changed, the magnitude of the aberration is also changed. Therefore, if the main light beam is adjusted in this manner, it is necessary to thereafter perform an adjustment for reducing the aberration itself.

In contrast, as an element of the projection optical system 5, the parallel flat plate 7 incorporated in the projection optical system 5 can parallel-translate the main light beam in accordance with the inclination and the thickness thereof. At this time, it can parallel-translate the distribution of the aberration without changing the form of the distribution of the aberration.

As described above, the parallel translation of the main light beam by changing the inclination of the parallel flat plate 7 incorporated into the projection optical system 5 does not change the form of the distribution of the aberration. Therefore, the alignment apparatus can be adjusted easily and quickly.

Further, a light stop 8 for limiting coherency is inserted between lenses of the illuminating optical system 1. Illuminating light is limited by the light stop 8, so that the influence of the coma of the enlarging projection optical system 5 can be enhanced.

The inclination of the parallel flat plate 7 is adjusted on the basis of the image of the aberration measurement mark detected by the CCD camera 6 and the distribution of the coma. As a result, the optical axis of the enlarging projection optical system 5 is adjusted to parallel-translate an eccentric component of the coma, thereby adjusting the alignment apparatus. The adjusting operation and the principle thereof will be described below in detail.

The general optical system has aberration called "coma". A document 3 (Max Born and Emil Wolf, "Principles of Optics", 6th edition, (Pergamon Press)) describes that the coma is aberration in which the wave-front aberration $\Phi$ on the pupil surface of the optical system is represented by the following equation (1):

$$\Phi = F y_0 \rho^3 \cos \theta \quad (1)$$

In the equation (1), F denotes a coefficient indicating the magnitude of the coma, $(\rho, \theta)$ denote polar coordinates on the pupil surface, and $y_0$ denotes a distance from the center of the optical axis on the substrate 4.

FIG. 4 shows a point image in an optical system having coma. As shown in FIG. 4, the point images formed in an optical system having coma have a shape like a comet having a trail. Due to this shape, when the pattern is Fourier-expanded, the higher the frequency of the component, the more the image is shifted and blurred. In other words, the image is shifted depending on the shape of the mark. Therefore, a low frequency component forms a focused image near the point image, whereas a high frequency component forms a blurred pattern image greatly shifted in the y axis direction.

FIG. 5 shows the relationship between a distribution of coma and an aberration measuring mark. Ideally, the distribution of coma forms concentric circles as shown in FIG. 5. This is also understandable from the equation (1). However, in the projection optical system of an actual alignment apparatus, the center 32 of an aberration measuring mark 31 (the center of the optical system) does not necessarily coincide with the center 34 of coma distribution 33. Rather, in general, they are deviated from each other.

To solve this problem, the optical axis is parallel-translated by adjusting the inclination of the parallel flat plate 7 incorporated into the projection optical system 5, so that the center 32 of the aberration measuring mark can coincide with the center 34 of the coma distribution. As a result, the symmetry of the coma in the optical system is improved, while the alignment offset, which varies among alignment apparatuses and alignment marks, is reduced.

As described above, according to this embodiment, the main light beam is parallel-translated by adjusting the inclination of the parallel flat plate 7 inserted in the projection optical system 5. With this feature, the aberration can be corrected without changing the shape of the aberration distribution. Therefore, the alignment apparatus can be adjusted easily and quickly.

Second Embodiment

FIGS. 6A to 10 are diagrams for explaining a method for adjusting an alignment apparatus according to a second embodiment of the present invention. This embodiment is a concrete method for measuring an aberration by means of an alignment apparatus similar to the first embodiment. In the following, descriptions of parts common to the first embodiment will be omitted.

The second embodiment is characterized in that the alignment apparatus has a function of parallel-translating the main light beam of the projection optical system, and that an aberration measuring mark for measuring aberration of the projection optical system is arranged on a substrate, so that the main light beam is parallel-translated by means of the measurement value obtained from the aberration measuring mark, thereby making the center of the optical axis of the projecting lens substantially coincide with the center of the aberration distribution.

The general optical system has wave-front aberration, which blurs a detected image of the alignment mark or makes the image out of the position. Therefore, when the position of the alignment mark is measured on the basis of the detected image of the alignment mark, offset between the position of the detected image and the actual position occurs. The wave-front aberration is classified into spherical aberration, astigmatism, curvature of field, coma and distortion, as described in the above document 2. In coma and distortion, an image of a pattern is shifted in a lateral direction.

Distortion is not particularly important, since all patterns are distorted equally, regardless of the size of the pattern. In contrast, coma is particularly important, since the amount of deviation varies depending on the size or structure of the pattern.

As is understandable from FIG. 4, the amount of coma varies depending on the size of the pattern. Therefore, the magnitude of coma can be estimated by comparing positions of images of two patterns which are different in size. By virtue of this feature, two kinds of patterns having different sizes can be used as an aberration measuring mark.

Generally, coma has a concentric distribution as shown in FIG. 5. It is difficult and therefore not practical to reduce the magnitude of the coma. However, it is comparatively easy to adjust the center of the coma distribution.

Therefore, the alignment apparatus is provided with the function of parallel-translating the main light beam as a function of adjusting the aberration of the projection optical system, so that the amount of movement is adjusted on the basis of the measurement value obtained from the aberration measuring mark. As a result, the center of the coma distribution can coincide with the center of projection optical axis. This adjustment realizes an alignment apparatus in which the alignment offset, which varies among alignment apparatuses and alignment marks, is reduced.

Figure 6A:
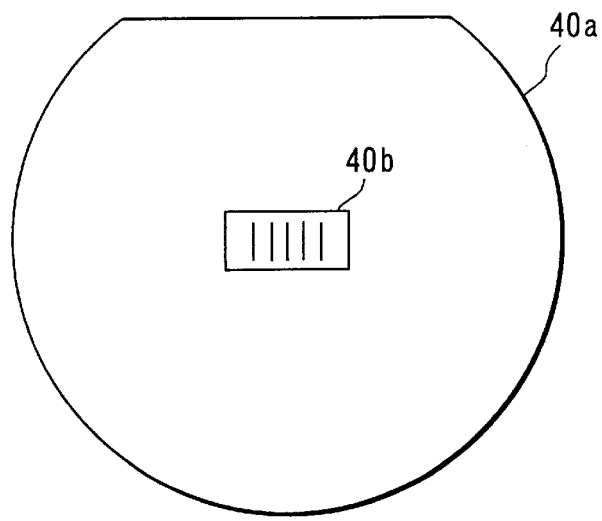
FIG. 6A is a plan view of a wafer on which an aberration measuring mark according to a second embodiment of the present invention is formed.

FIG. 6A is a plan view of a wafer on which an aberration measuring mark of this embodiment of the present invention is formed. In FIG. 6A, reference numerals 40a and 40b respectively denote a wafer and an aberration measuring mark. Although the aberration measuring mark 40b is located near the center of the wafer 40a in this drawing, the position and the number of marks are not limited.

Figure 6B:
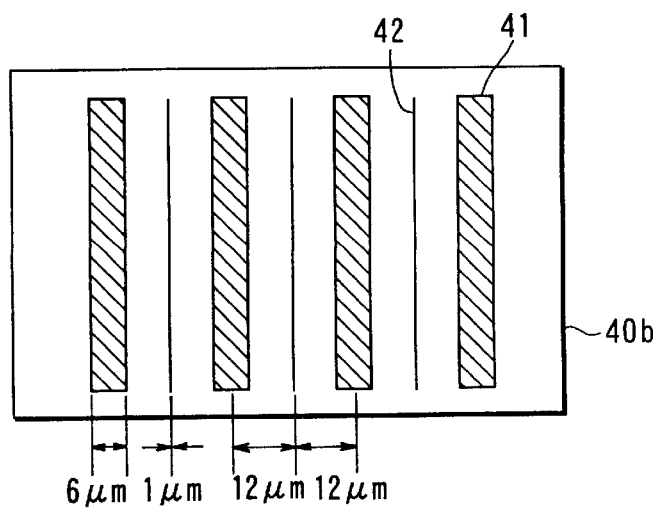
FIG. 6B is an enlarged view of the aberration measuring mark shown in FIG. 6A.

FIG. 6B is an enlarged view of the aberration measuring mark 40b. In FIG. 6B, reference numerals 41 and 42 respectively denote a large pattern and a small pattern. In the mark 40b, a first mark portion constituted by the large patterns 41 and a second mark portion constituted by the small patterns 42 are arranged side by side in parallel with each other, extending from the top to the bottom of the drawing. The first and second mark portions are arranged symmetrically and alternately. The large pattern 41 is thicker than the small pattern 42. The large pattern 41 is a line pattern having a 6 μm width and the small pattern 42 is a line pattern having a 1 μm width. The large patterns and the small patterns are arranged such that the pattern width of a large pattern is greater than that of a small pattern in one direction. More specifically, the large pattern 41 and the small pattern 42 are arranged with a pitch of 24 μm, so that the length directions of the large patterns 41 and the small patterns 42 are parallel.

Figure 7:
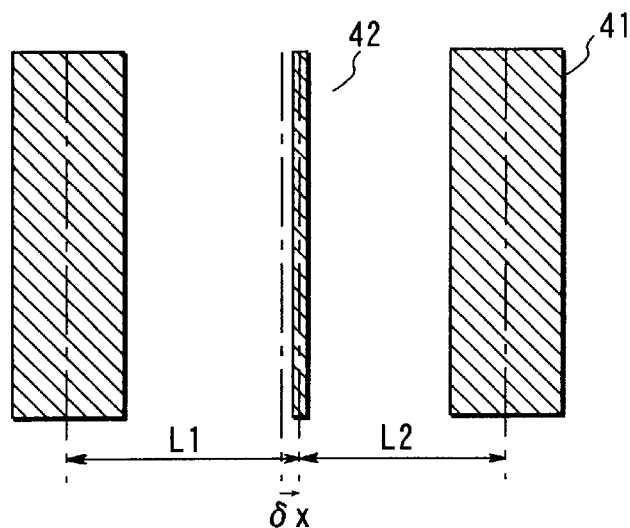
FIG. 7 is a diagram showing patterns of the aberration measuring mark observed by the alignment apparatus.

FIG. 7 shows patterns of the aberration measuring mark shown in FIG. 6B observed by the alignment apparatus having coma.

In an optical system having coma, the position of a transferred pattern is deviated in accordance with the size of the pattern. There is a tendency that the smaller the pattern, the greater the amount of deviation. Therefore, when the mark shown in FIG. 6B is observed by the alignment apparatus having coma, it looks as if the 1 μm pattern were deviated relative to the 6 μm pattern, as shown in FIG. 7.

At this time, the amount of deviation of the 1 μm pattern $\delta x=(L1-L2)/2$ can be calculated from the distances (L1 and L2) between the 1 μm pattern and 6 μm patterns on both sides thereof. The distances are measured in the state where the stop of the illuminating optical system is reduced as compared to the normal condition, and the illumination coherency is set to about 0.1. Since the amount of deviation $\delta x$ is substantially proportional to the magnitude of the coma, the direction and magnitude of the coma can be estimated from the value of $\delta x$.

The center of the coma distribution obtained by the above measurement is made coincide with the center of the aberration measuring mark (the center of the optical axis) by the function of parallel-translating the main light beam. Thus, the present invention realizes an alignment apparatus in which the alignment offset, which varies among alignment apparatuses and alignment marks, is reduced.

The same effect is obtained by using marks as shown in FIGS. 8A to 8E instead of the mark shown in FIG. 6B.

Figure 8A:
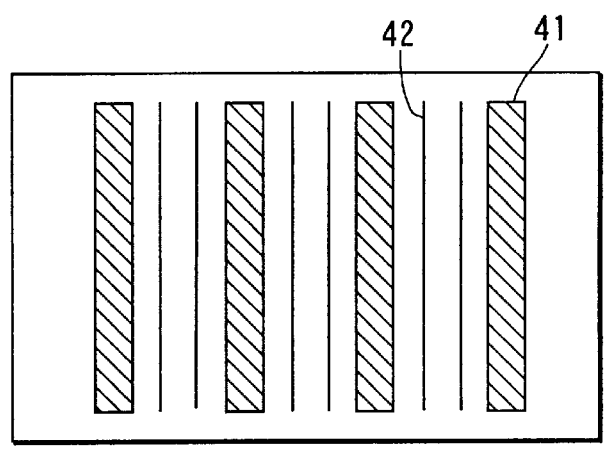
FIGS. 8A to 8E are diagrams showing modifications of the aberration measuring mark of the second embodiment.
Figure 8B:
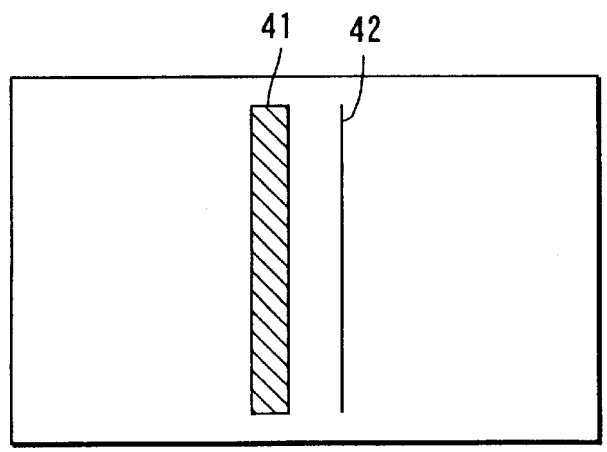
Figure 8C:
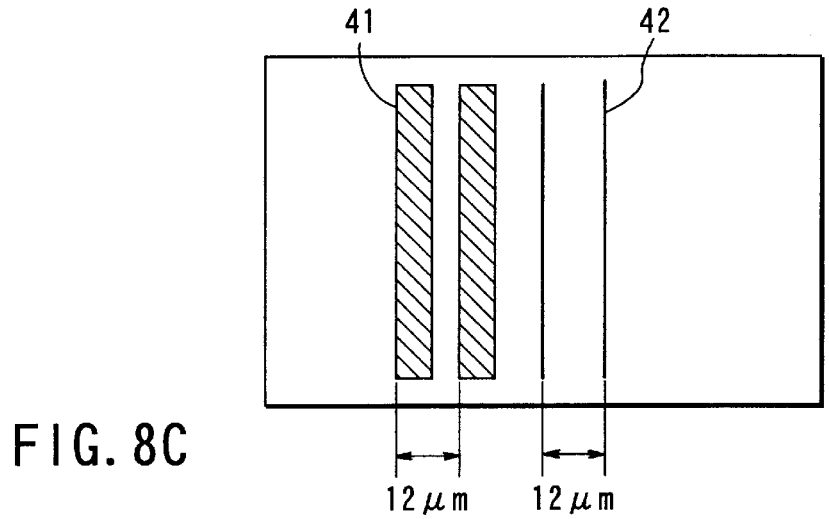
Figure 8D:
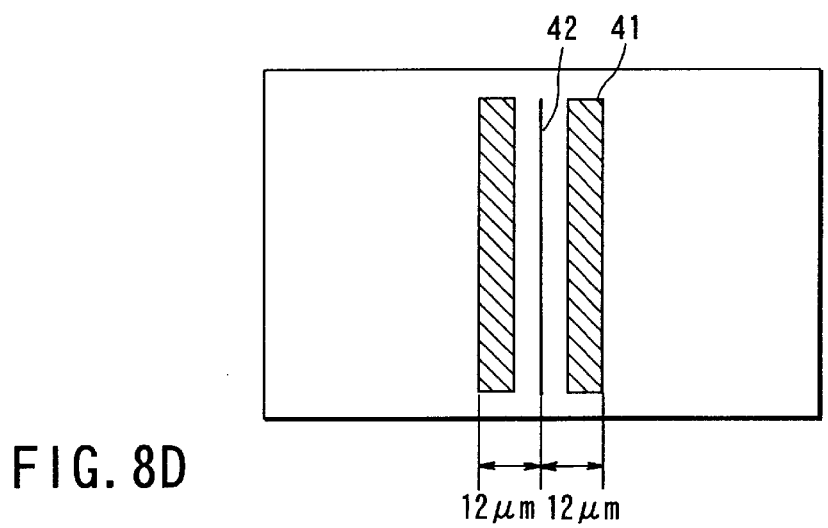
Figure 8E:
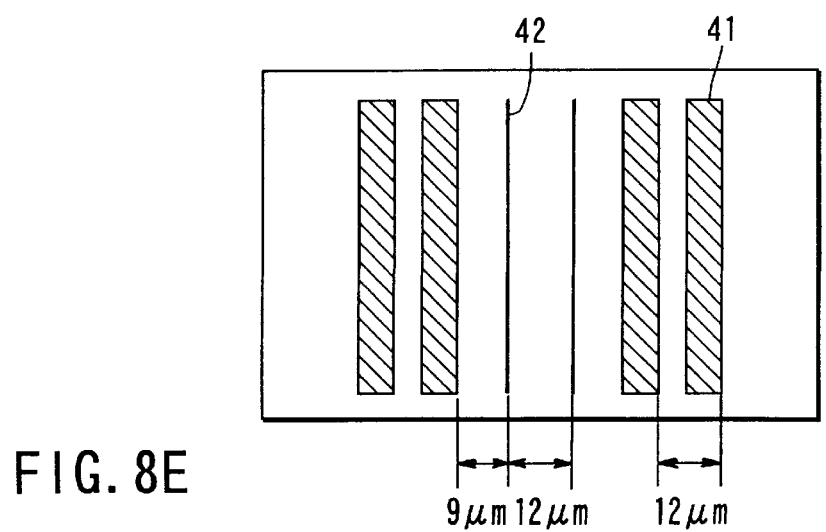

In the mark shown in FIG. 8A, a plurality of small patterns 42 are used in place of the small pattern 42 of the mark shown in FIG. 6B. In the mark shown in FIG. 8B, one large pattern 41 and one small pattern 42 are arranged side by side. In the mark shown in FIG. 8C, two large patterns and two small patterns are arranged side by side. In the mark shown in FIG. 8D, a small pattern 42 is arranged between two large patterns 41. In the mark shown in FIG. 8E, two small patterns 42 are arranged between pairs of large patterns 41.

Although the large patterns 41 and the small patterns 42 are not arranged alternately in the marks shown in FIGS. 8A to 8E, the amount of deviation can be measured so long as two types of patterns are arranged side by side. Accordingly, the aberration can be measured. In particular, the pattern shown in FIG. 8B has only one large pattern 41 and one small pattern 42, in which case, the aberration can be measured satisfactorily in, for example, initial adjustment.

As described above, the coma of the projection lens or the deviation of the center of the optical axis from the coma is calculated from the distance between the images of large patterns and small patterns arranged alternately at regular intervals, in the state where the coherency is limited by the light stop 8. As a result, the aberration can be measured. Further, the result of measurement can be fed back to adjustment of the inclination of the parallel flat plate.

Third Embodiment

Figure 9:
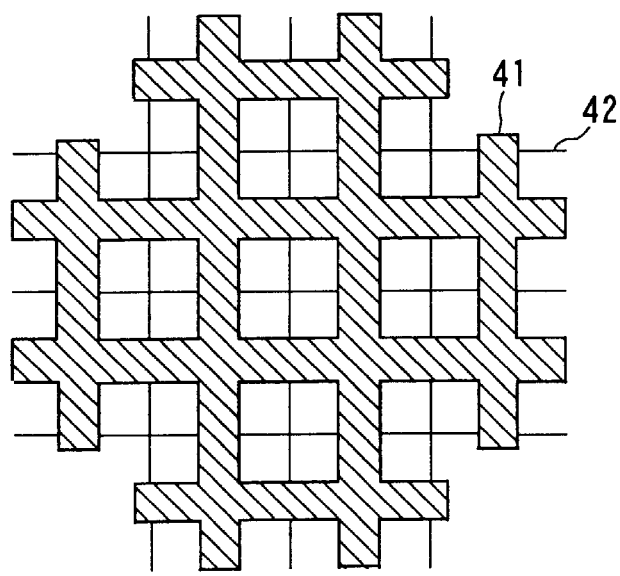
FIG. 9 is a diagram showing a structure of an aberration measuring mark according to a third embodiment of the present invention.

FIG. 9 is a diagram showing a structure of an aberration measuring mark used in an alignment apparatus according to a third embodiment of the present invention. The third embodiment is a modification of the second embodiment. This embodiment is characterized in that a first mark portion consisting of large patterns and a second mark portion consisting of small patterns are arranged symmetrically and alternately in two directions, thereby forming an aberration measuring mark for use in the method for adjusting the alignment apparatus. This aberration measuring mark is obtained by arranging two aberration measuring marks shown in FIG. 6B in directions perpendicular to each other. This mark is also formed in a portion of the wafer 40a as shown in FIG. 6A.

The mark as described above is advantageous in the following respect.

In general, to parallel-translate the main light beam of the optical system, an element (a lens, a mirror or a flat plate,etc.) of the optical system is parallel moved or the inclination thereof is adjusted. These elements are generally supported by three points, so that the elements can withstand stress applied thereto and positioning can be assured. Due to the three-point support, it is impossible to independently adjust parallel translation of the main light beam in two perpendicular directions. In other words, when the main light beam is adjusted in the x direction, it is inevitably deviated in the $y_0$ direction. Therefore, if the measurement mark for the x direction is different from the measurement mark for the $y_0$ direction, it is necessary to switch the two marks when adjusting the light beam in the two directions, result in considerable reduction in efficiency.

To avoid this, if the aberration measuring mark as shown in FIG. 9 is used, the coma distributions in two perpendicular directions can be simultaneously measured. Therefore, the adjustment efficiency and speed with respect to an element supported by three point can be improved.

The aberration measuring mark of this embodiment has patterns crossing in two perpendicular directions; however, the patterns need not be perpendicular to each other, so long as they cross at an angle in two directions. Further, the aberration measuring mark is not necessarily constituted by line patterns. It may be constituted by any patterns of different sizes of the numbers at a desired ratio, so long as different patterns are arranged alternately. Furthermore, even if an element is not supported by three points in the optical system, the same effect can be obtained.

Fourth Embodiment

Figure 10:
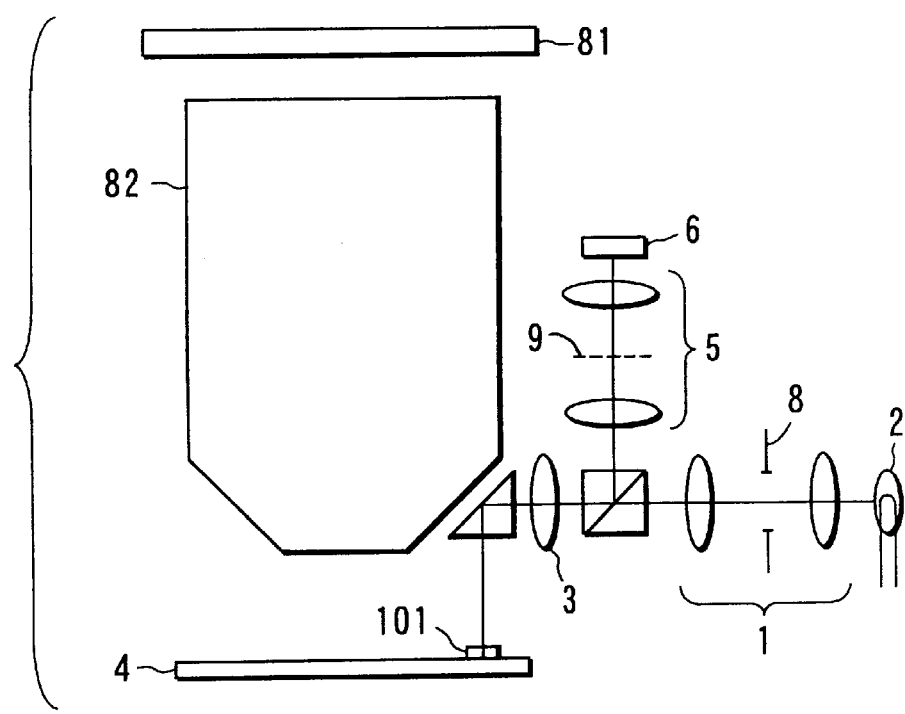
FIG. 10 is a diagram showing the overall structure of an alignment apparatus to which the present invention is applied.

FIG. 10 is a diagram showing the overall structure of an alignment apparatus to which the present invention is applied.

The fourth embodiment is characterized in that a mark for directly measuring aberration is used as an alignment mark.

As shown in FIG. 10, the light beam emitted from the halogen lamp 2 is passed through the objective 3 via the illuminating optical system 1, and radiated on an alignment mark 101 formed on the substrate 4. Light reflected by a portion of the substrate including the alignment mark 101 forms an image of the alignment mark on the light receiving surface of the CCD camera 6 through the enlarging projection optical system 5.

A light stop 8 and a 180° phase plate 9 are arranged at positions as shown in FIG. 10. Only the light passed through the central portions of the lenses is 180° phase-shifted. As a result, alignment can be achieved by an alignment mark, from which a satisfactory alignment signal could not be obtained by a conventional apparatus.

Figure 2A:
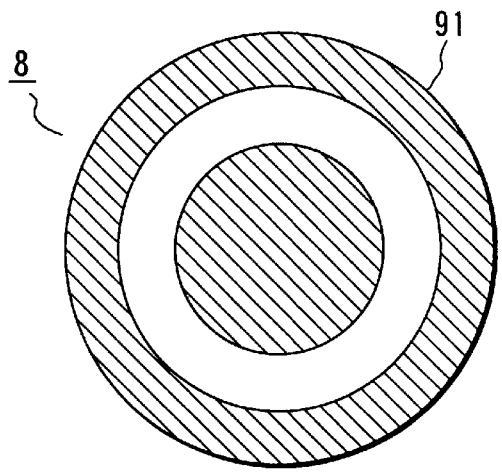
FIG. 2A is a diagram showing a structure of a light stop used in the conventional alignment apparatus.
Figure 2B:
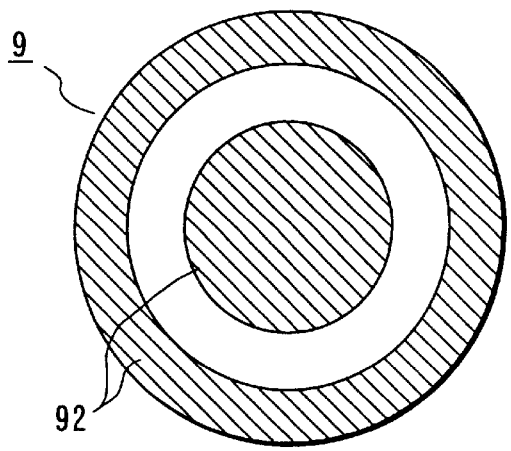
FIG. 2B is a diagram showing a structure of a phase plate used in the conventional alignment apparatus.

The light stop 8 and the phase plate 9 are shown in FIGS. 2A and 2B. FIG. 2A is a plan view of the light stop 8 and the FIG. 2B is a plan view of the phase plate 9. As shown in FIGS. 2A and 2B, the light stop 8 and the phase plate 9 have similar figures. A light shielding portion 91 of the light stop 8 corresponds to a 180° phase shifter of the phase plate 9. Reference numerals 81 and 82 respectively denote a reticle and an exposure tool.

The general alignment apparatus inevitably has factors of an error, such as residual aberration which is already present in a design stage, aberration due to an adjustment error in the stage of assembly of the optical system, deviation between the enlarging projection optical system 5 and the pupil, deviation between the optical axis of the illuminating optical system 1 and the light stop 8, and illumination variation of the halogen lamp 2. Of these factors of an error, the aberration of the enlarging projection optical system 5, particularly the coma, shifts the image of a pattern depending on the size of each pattern of the alignment mark or the type of the controller. Therefore, to improve the alignment accuracy, it is important to cope with the coma.

Figure 11A:
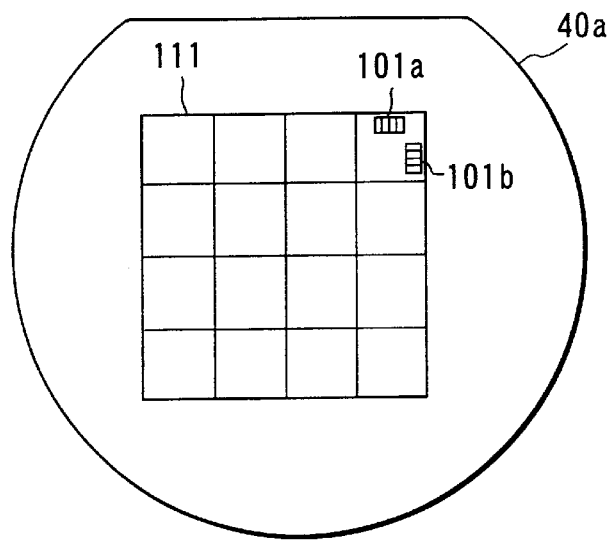
FIG. 11A is a diagram showing a wafer on which an alignment mark according to a fourth embodiment of the present invention is formed.

FIG. 11A shows a wafer 40a on which the alignment mark 101 of this embodiment is formed. As shown in FIG. 11A, the wafer 40a is divided into regions (real device pattern transfer blocks 111) on which a device pattern can be transferred in batch processing. Each block 111 includes a real device pattern (not shown) and alignment marks 101a and 101b for performing alignment adjustment in the x and y directions.

Figure 1:
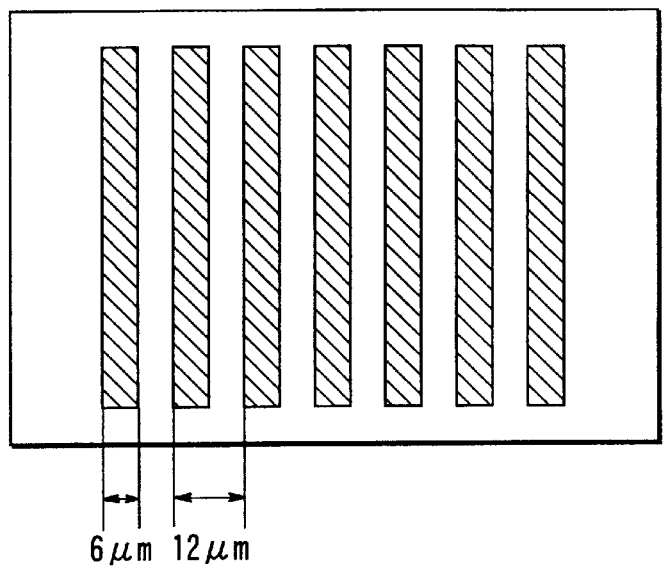
FIG. 1 is a diagram showing a structure of the conventional alignment mark.
Figure 11B:
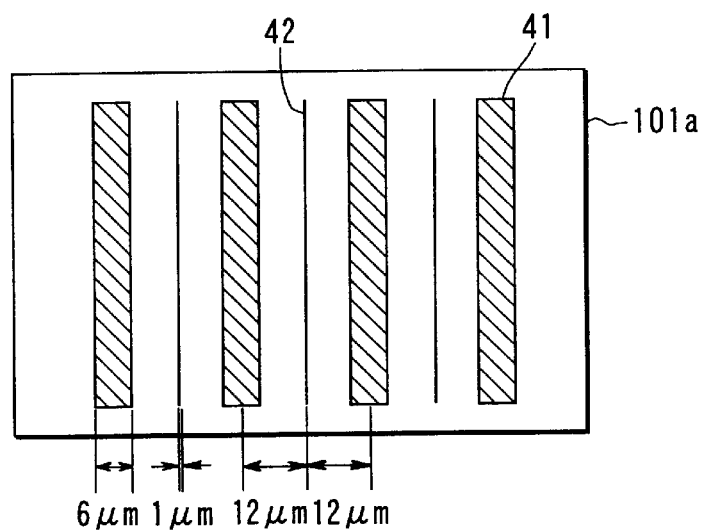
FIG. 11B is an enlarged view of the alignment mark shown in FIG. 11A.

The alignment marks 101a and 101b have the same shape and extend in different directions. FIG. 11B is an enlarged view of the alignment mark 101a for alignment adjustment in the x direction. The alignment mark 101a is obtained by using a small pattern 42 in place of every other belt-like pattern (large pattern 41) of the conventional alignment mark shown in FIG. 1; that is, large patterns 41 and small patterns 42 are alternately arranged. As the conventional alignment mark shown in FIG. 1, the alignment mark shown in FIG. 11B may have a grooved or projecting cross-sectional structure.

Figure 12:
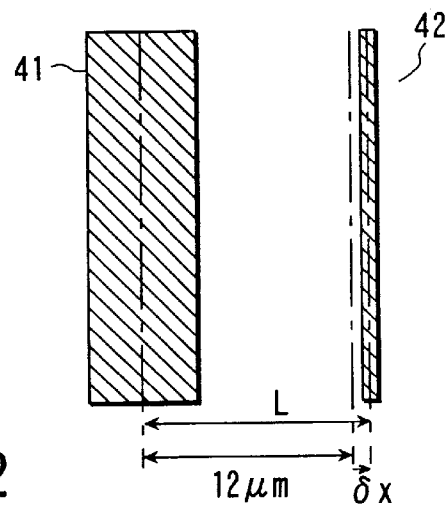
FIG. 12 is a diagram showing patterns of the alignment mark observed by an alignment apparatus.

FIG. 12 shows patterns of the alignment mark shown in FIG. 11B observed by an alignment apparatus having coma. In an optical system having coma, the position of a transferred pattern is deviated in accordance with the size of the pattern. The amount of deviation depends on the size of the pattern. Therefore, when the mark shown in FIG. 11B is observed by the alignment apparatus having coma, it looks as if the 1 $\mu$m pattern were deviated relative to the 6 $\mu$m pattern, as shown in FIG. 12. At this time, the amount of relative deviation of the 1 $\mu$m pattern $\delta x=12$ $\mu$m-L can be calculated from the distance (L) between the 1 $\mu$m pattern and the 6 $\mu$m pattern. Since the amount of relative deviation $\delta x$ is substantially proportional to the magnitude of the coma, the direction and magnitude of the coma can be estimated from the value of $\delta x$.

As described above, with the alignment mark shown in FIG. 11B, the position of the alignment mark and the magnitude of the coma of the alignment apparatus can be measured simultaneously. In other words, the amount of error in position of the alignment mark due to the coma can be estimated in the process of alignment. Therefore, it is possible to realize alignment in which the amount of error is corrected in advance.

Figure 13A:
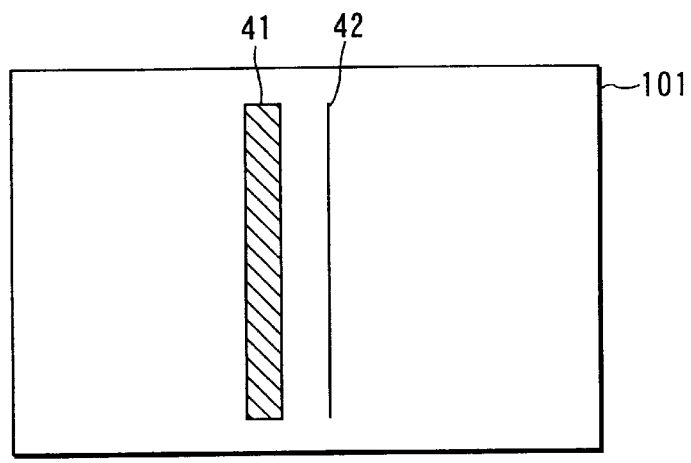
FIGS. 13A and 13B are diagrams showing modifications of the alignment mark of the fourth embodiment.
Figure 13B:
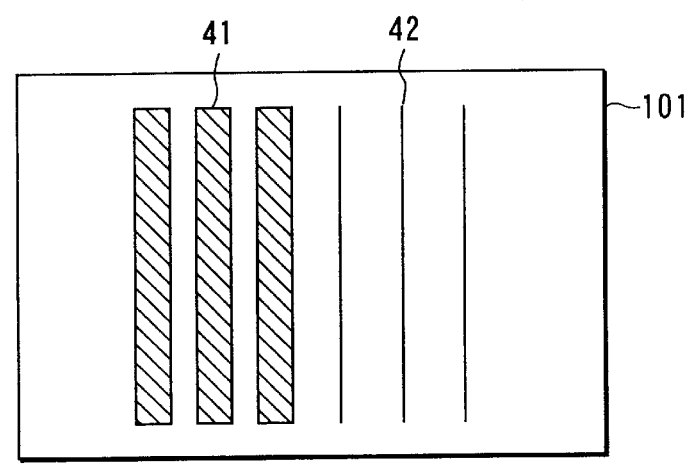

This embodiment is not limited to the mark shown in FIG. 11B. For example, the alignment mark may be constituted by a set of a large pattern 41 and a small pattern 42 as shown in FIG. 13A, or a plurality of large patterns 41 and a plurality of small patterns 42 as shown in FIG. 13B.

Fifth Embodiment

Figure 14:
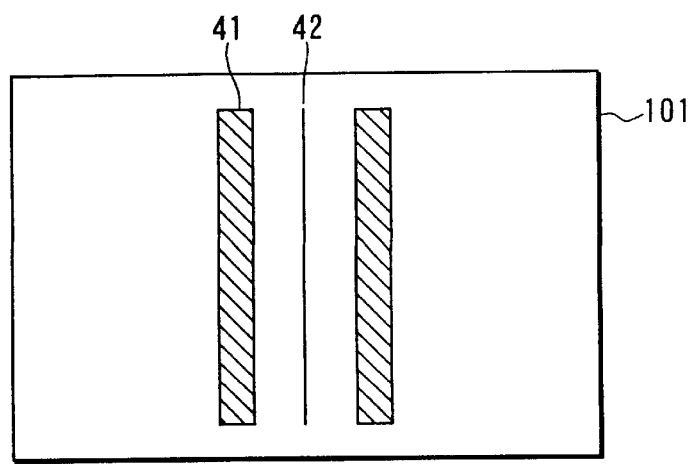
FIG. 14 is a diagram showing a structure of an alignment mark according to a fifth embodiment of the present invention.

FIG. 14 is a diagram showing a structure of an aberration measuring mark used in an alignment apparatus according to a fifth embodiment of the present invention. The fifth embodiment is a modification of the fourth embodiment. This embodiment is characterized in that two large patterns are arranged symmetrically with a small pattern interposed therebetween.

Figure 15:
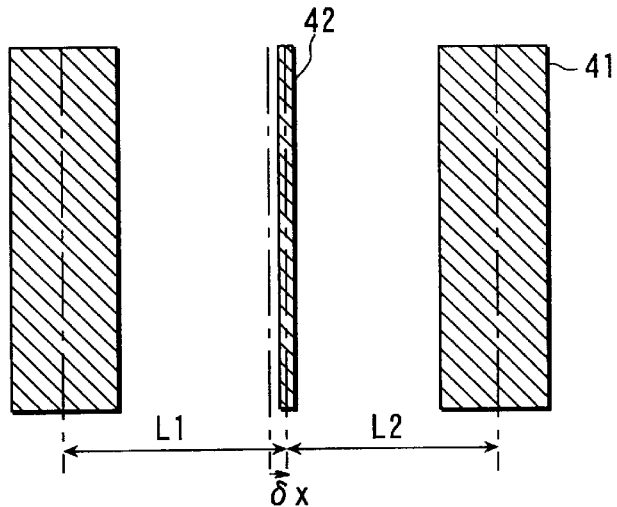
FIG. 15 is a diagram showing patterns of the alignment mark of the fifth embodiment observed by an alignment apparatus having coma.

FIG. 15 shows patterns of the alignment mark shown in FIG. 14 observed by the alignment apparatus having coma. In FIG. 15, it looks as if the 1 $\mu$m pattern were deviated relative to the 6 $\mu$m pattern, as in the fourth embodiment. At this time, the amount of relative deviation of the 1 $\mu$m pattern, $\delta x=(L1-L2)/2$ can be calculated from the distances (L1 and L2) between the 1 $\mu$m pattern and 6 $\mu$m patterns on both sides thereof. This alignment mark is advantageous in the following respect.

The general alignment optical system has a magnification error and distortion. The magnification error cannot be a factor of a measurement error in an alignment process. The distortion can be a measurement error; however, since the magnitude thereof is constant, the distortion can be coped with by adding a constant offset value to a measurement result. Therefore, the distortion cannot be an alignment error.

However, when the amount of relative deviation $\delta x$ is calculated from the distances between the small pattern 42 and the large pattern 41 with the alignment mark of the fourth embodiment, the distances may be deviated from the design value of 12 $\mu$m, even if coma is not present. In this case, it is necessary that the magnification and distortion be obtained in advance. For this purpose, the amount of deviation $\delta x$ is calculated as in the fifth embodiment. The amount of deviation $\delta x$ thus obtained is not influenced by the magnification error or the distortion. Therefore, alignment without the influence thereof can be realized.

Figure 16A:
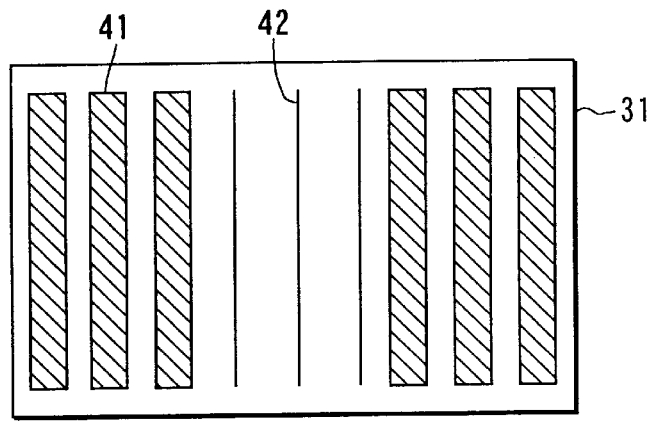
FIGS. 16A and 16B are diagrams showing modifications of the alignment mark of the fifth embodiment.
Figure 16B:
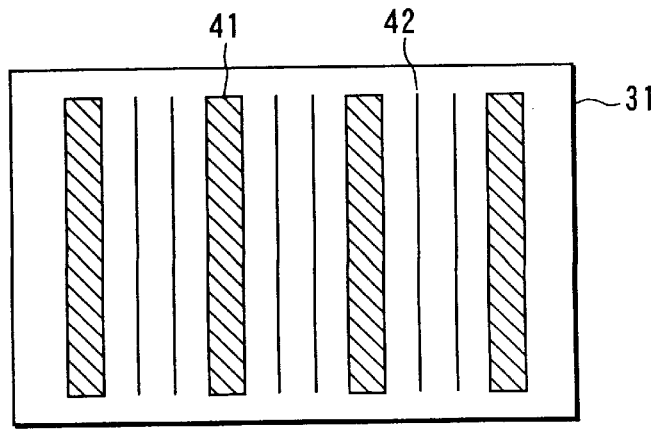

This embodiment is not limited to the alignment mark as shown in FIG. 14 but can be of another structure. For example, the alignment mark may be constituted by two sets of a plurality of large patterns 41 and a set of a plurality of small patterns 42 interposed between the sets of large patterns, as shown in FIG. 16A. Alternatively, it may be constituted by large patterns 41 and small patterns 42 of the numbers at a ratio other than 1:1, as shown in FIG. 16B.

Sixth Embodiment

Figure 17A:
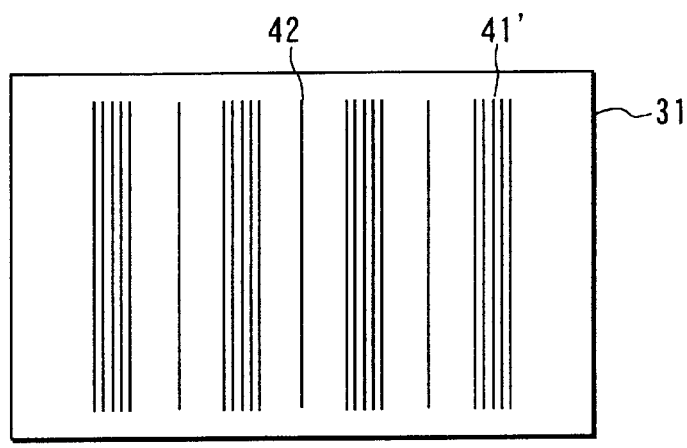
FIG. 17A is a diagram showing a structure of an alignment mark according to a sixth embodiment of the present invention.

FIG. 17A is a diagram showing a structure of an alignment mark according to a sixth embodiment of the present invention. The sixth embodiment is a modification of the fourth embodiment. In the sixth embodiment, very small patterns, which cannot be separately observed with the resolution of an alignment optical system, are arranged close to one another. This embodiment is characterized in that a group of closely-arranged small patterns substantially functions as a large pattern 41'.

FIG. 17A shows an alignment mark in which a group of thin belt-like patterns close to one another functions as a large pattern 41'. The reason why the closely arranged patterns function as a large pattern 41' will be described below.

In general, the maximum and minimum sizes of patterns, constituting an alignment mark for use in actually manufacturing semiconductor devices, are limited due to restrictions in the manufacturing process. For this reason, in some cases, a large pattern having a 6 $\mu$m width cannot be used. In such a case, an alignment mark must be formed by using patterns of sizes within the restrictions in the manufacturing process. For this purpose, very small patterns, which cannot be separately observed with the resolution of the alignment optical system, are arranged close to one another, and the group of the patterns is used as a large pattern. In this case, since the group of small patterns is recognized by the alignment system as a large pattern, it functions substantially the same as the large pattern 41 used in the fourth and fifth embodiments.

As described above, even if the pattern size is restricted by the manufacturing process, the alignment mark of this embodiment can be used in substantially the same manner as the combination of the large pattern 41' and the small pattern 42.

Figure 17B:
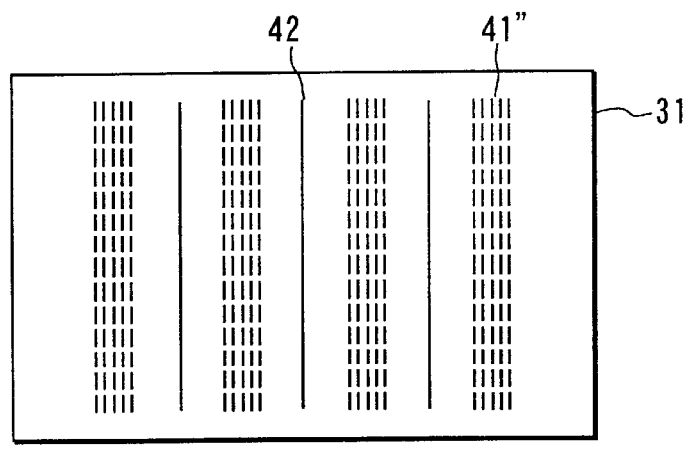
FIGS. 17B to 17D are diagrams showing modifications of the alignment mark of the sixth embodiment.
Figure 17C:
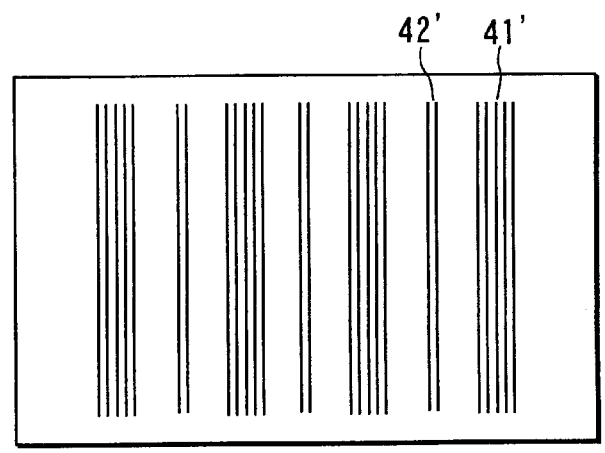
Figure 17D:
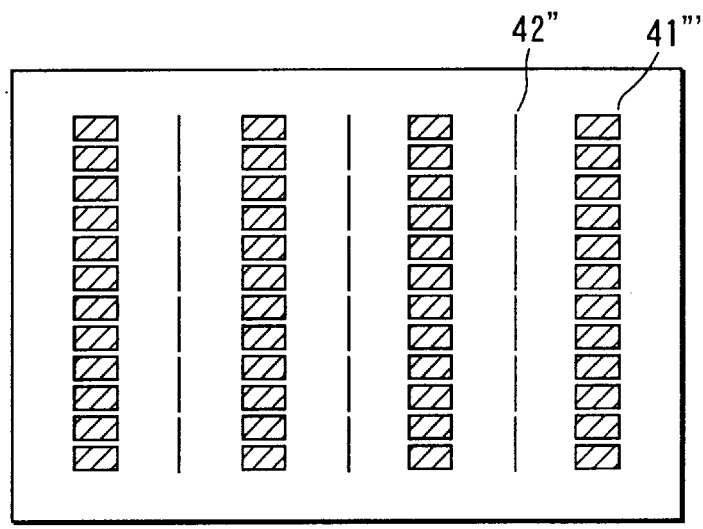

This embodiment is not limited to the alignment mark as shown in FIG. 17A. For example, as shown in FIG. 17B, a large pattern 41" can be used, in which each of the small patterns constituting the large patterns 41' is divided into a plurality of parts in the longitudinal direction. Any pattern can be used, so long as it is constituted by small patterns which cannot be detected with the resolution of the alignment optical system. Further, as shown in FIG. 17C, a small pattern 42', as well as the large pattern 41', may be constituted by thinner patterns. Furthermore, as shown in FIG. 17D, both a large pattern 41''' and a small pattern 42" may be divided into a plurality of parts in the longitudinal direction of the line pattern. In this case, the divided patterns need not be such small patterns that cannot be detected with the resolution of the alignment sensor.

Seventh Embodiment

Figure 18:
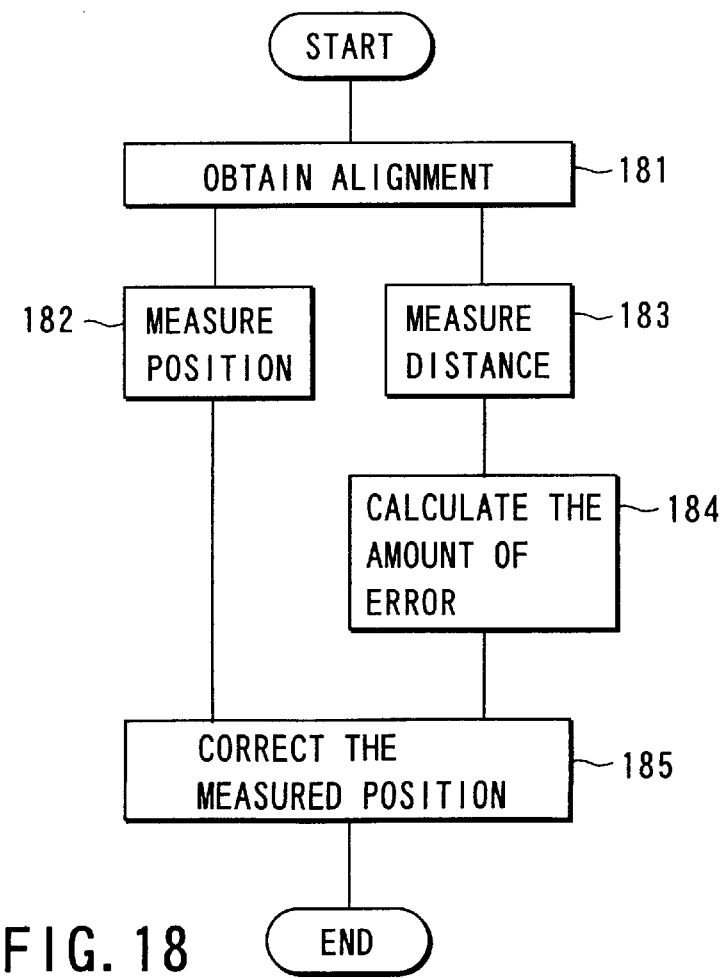
FIG. 18 is a flowchart showing a mark position measuring process in the alignment according to a seventh embodiment of the present invention.

FIG. 18 is a flowchart showing a mark position measuring process in the alignment according to a seventh embodiment of the present invention. In the following, actual signal processing in the alignment will be described.

First, a light beam is radiated on the alignment mark in the same manner as in the conventional exposure. Scattered light from the alignment mark is received by the CCD camera, so that an alignment signal waveform is obtained (181).

Then, the position of the alignment mark is measured on the basis of the alignment signal waveform in the same manner as in the conventional process (182). In parallel with the measurement of the mark position, the distance between a large pattern 41 and a small pattern 42 is measured (183). Then, the amount of error of the measured position of the alignment mark is calculated from the measured distance (184).

Subsequently, a correct position of the alignment mark is calculated on the basis of the measured position of the mark and the amount of error.

Figure 19:
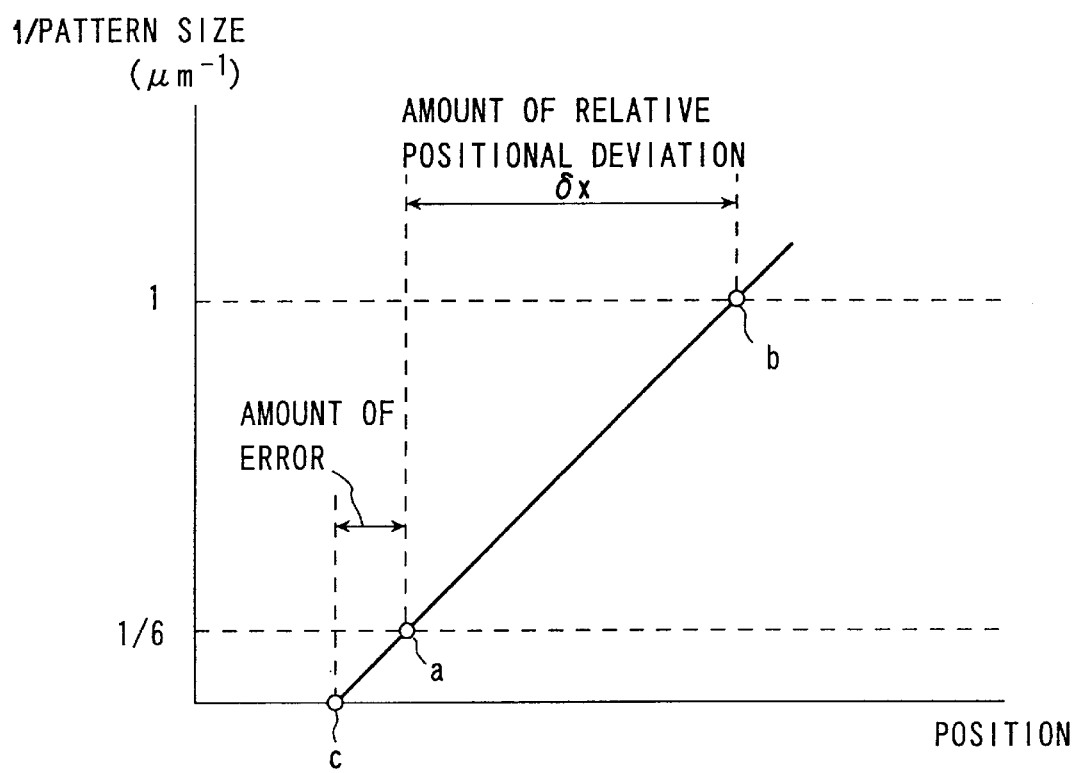
FIG. 19 is a diagram showing a process of calculating the amount of an error according to the seventh embodiment.

An example of the aforementioned step of calculating the error (184) will be described with reference to FIG. 19.

In the general alignment apparatus comprising a halogen lamp and having a numerical aperture of 0.3, the amount of positional deviation is substantially inversely proportional to the pattern size. Therefore, where the abscissa denotes a position of the pattern and the ordinate denotes a reciprocal of the pattern size, the actual position (c) of the alignment mark is a point at the intersection between the abscissa and the line passing through the position (a) of the large pattern and the position (b) of the small pattern, i.e., the point at which the reciprocal of the pattern size is substantially 0. Therefore, if alignment is performed with reference to the position (c), the amount of positional error which occurs in every alignment mark can be corrected simultaneously with the normal position measurement.

Further, the parallel flat plate 7 of the first embodiment shown in FIG. 3 can be arranged in the optical path of the light received by the CCD camera 6. In this case, the aberration can be corrected in accordance with the calculated amount of positional error, so that the inclination of the line passing through the positions (a and b) shown in FIG. 19 can be increased. As a result, the amount of relative positional deviation δx can be reduced, thereby enabling a more accurate estimate of the amount of error and correcting the coma.

The present invention is not limited to the above embodiments. For example, the widths of the large pattern 42 and the small pattern 42 are not limited to the combination of 6 μm and 1 μm. Since the optimum combination of dimensions varies depending on the numerical aperture and the illumination coherency of the alignment optical system, the wavelength of the light source, etc., it is determined through experiments using the alignment apparatus. Further, the structure of the alignment mark is not limited to the projecting or grooved cross-sectional structure as in the embodiments, or a buried type. It may be of any type which can be detected by the alignment sensor.

As has been described above, according to the present invention, since the deviation of the center of the coma distribution can be adjusted, an alignment offset which varies among alignment apparatuses or alignment marks is reduced.

Further, according to another aspect of the present invention, an alignment mark consisting of thick and small patterns arranged side by side is used, so that the magnitude of coma can be estimated from the positional deviation of the pattern due to the eccentricity of the coma. As a result, the alignment offset can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An aberration measuring method comprising the steps of:
    illuminating through an illuminating optical system an aberration measuring mark including a first mark portion including a large pattern having a wide pattern width and a second mark portion including a small pattern having a pattern width narrower than that of the large pattern, the large pattern and the small pattern being arrange in parallel and adjacent to each other in at least one direction;
    projecting an image of the aberration measuring mark onto a light receiving surface of a detector through a projection optical system;
    detecting positions of the large pattern and the small pattern of the aberration measuring mark; and
    measuring aberration based on the positions of the large pattern and the small pattern.

2. An aberration measuring method according to claim 1, wherein one of the first mark portion and the second mark portion is arranged symmetrical with respect to the other.

3. An aberration measuring method according to claim 1, wherein the aberration measuring mark has a plurality of large patterns and small patterns of numbers at a desired ratio, which are alternately arranged.

4. An aberration measuring method according to claim 1, wherein at least one of the large pattern and the small pattern is made of a plurality of very small patterns which cannot be observed with resolution of the optical systems used in alignment, the very small patterns being arranged close to one another to function as the large pattern or the small pattern.

5. An aberration measuring method according to claim 1, wherein a light projected onto the light receiving surface is parallel-translated based on the measured aberration, so that the aberration is symmetric with respect to a center of the projection optical system.

6. An aberration measuring method according to claim 1, wherein first mark portions and second mark portions of numbers at a desired ratio are arranged alternately and symmetrically in two directions.

7. An aberration measuring method according to claim 1, wherein a light projected onto the light receiving surface is parallel-translated based on the measured aberration by a parallel flat plate mounted in the projection optical system, so that the aberration is symmetric with respect to a center of the projection optical system.

8. An aberration measuring method according to claim 1, wherein the aberration is measured by calculating an amount of error in detection of the aberration measuring mark from a difference between the position of the large pattern and the position of the small pattern.

9. An aberration measuring method according to claim 1, wherein the aberration is measured in a process of adjusting an alignment apparatus.

10. An aberration measuring method according to claim 1, wherein the aberration is measured in a process of aligning pattern exposure of a real device, and the aberration measuring mark functions as an alignment mark.

11. An aberration measuring method according to claim 1, wherein the aberration is measured in a process of aligning pattern exposure of a real device, the aberration measuring mark functions as an alignment mark, the aberration is measured by calculating an amount of error in detection of the aberration measuring mark from a difference between the position of the large pattern and the position of the small pattern, and a correct position of the aberration measuring mark is calculated from at least one of the position of the large pattern and the position of the small pattern, and the amount of error.

12. An aberration measuring mark comprising a first mark portion including a large pattern having a wide pattern width and a second mark portion including a small pattern having a pattern width narrower than that of the large pattern, the large pattern and the small pattern being arranged in parallel and adjacent to each other in at least one direction, and wherein aberration is measured by a pattern image obtained from light reflected by the large and small patterns.

13. An aberration measuring mark according to claim 12, wherein one of the first mark portion and the second mark portion is arranged symmetrical with respect to the other.

14. An aberration measuring mark according to claim 12, wherein the aberration measuring mark has a plurality of large patterns and small patterns of numbers at a desired ratio, which are alternately arranged.

15. An aberration measuring mark according to claim 12, wherein at least one of the large pattern and the small pattern is made of a plurality of very small patterns which cannot be observed with resolution of the optical systems used in alignment, the very small patterns being arranged close to one another to function as the large pattern or the small pattern.

16. An aberration measuring mark according to claim 12, wherein the large pattern and the small pattern constitute an alignment mark.

* * * * *

UNITED STATES PATENT AND TRADEMARK OFFICE
CERTIFICATE OF CORRECTION

PATENT NO. : 6,163,376
DATED : December 19, 2000
INVENTOR(S) : Hiroshi Nomura et al.

It is certified that error appears in the above-identified patent and that said Letters Patent is hereby corrected as shown below:

<u>Column 14,</u>
Line 22, "being arrange" should read -- being arranged --.

Signed and Sealed this

Thirtieth Day of April, 2002

Attest:

JAMES E. ROGAN
*Attesting Officer*  *Director of the United States Patent and Trademark Office*